(12) United States Patent
McMorrow

(10) Patent No.: US 7,719,356 B2
(45) Date of Patent: May 18, 2010

(54) PULSE AMPLIFIER

(75) Inventor: Robert J. McMorrow, Concord, MA (US)

(73) Assignee: Star RF, Inc., Waltham, MA (US)

( * ) Notice: Subject to any disclaimer, the term of this patent is extended or adjusted under 35 U.S.C. 154(b) by 174 days.

(21) Appl. No.: 11/985,468

(22) Filed: Nov. 15, 2007

(65) Prior Publication Data

US 2008/0116974 A1 May 22, 2008

Related U.S. Application Data

(60) Provisional application No. 60/866,147, filed on Nov. 16, 2006, provisional application No. 60/866,139, filed on Nov. 16, 2006, provisional application No. 60/866,144, filed on Nov. 16, 2006.

(51) Int. Cl.
*H03F 3/217* (2006.01)

(52) U.S. Cl. .................. 330/251; 330/262; 330/207 A

(58) Field of Classification Search ................ 330/251, 330/262, 207 A, 10
See application file for complete search history.

(56) References Cited

U.S. PATENT DOCUMENTS

| 4,092,610 | A | | 5/1978 | White et al. |
| 4,115,740 | A | * | 9/1978 | Yoshida et al. ............... 330/264 |
| 5,023,566 | A | | 6/1991 | El-Hamamsy et al. |
| 5,115,203 | A | | 5/1992 | Krett et al. |
| 5,115,205 | A | * | 5/1992 | Holmes, Jr. ................... 330/10 |
| 5,200,711 | A | * | 4/1993 | Andersson et al. ........... 330/267 |
| 5,306,986 | A | | 4/1994 | Siao |
| 5,396,194 | A | * | 3/1995 | Williamson et al. ......... 330/297 |
| 5,479,337 | A | | 12/1995 | Voigt |
| 5,483,197 | A | * | 1/1996 | Nishioka et al. ............. 330/273 |
| 5,612,647 | A | | 3/1997 | Malec |
| 5,729,175 | A | | 3/1998 | Ferrer |
| 5,963,086 | A | | 10/1999 | Hall |
| 6,014,055 | A | | 1/2000 | Chester |
| 6,127,885 | A | | 10/2000 | Colangelo |

(Continued)

FOREIGN PATENT DOCUMENTS

WO  WO 03/041249 A1  5/2003

(Continued)

OTHER PUBLICATIONS

A. Alipov and V. Kozyrev, "Push/Pull Class-DE Switching Power Amplifier", 2002 IEEE MTT-S International Microwave Symposium Digest, (IMS 2002), Seattle, WA, Jun. 2-7, 2002, IEEE MTT-S International Microwave Symposium, New York, NY, IEEE, US, Jun. 2, 2002, pp. 1635-1638, vol. 3 of 3.

(Continued)

*Primary Examiner*—Patricia Nguyen
(74) *Attorney, Agent, or Firm*—Wolf, Greenfield & Sacks, P.C.

(57) ABSTRACT

An amplifier stage capable of delivering a peak limited voltage pulse with sharp transitions, at a desired width and duty cycle, and with high efficiency is disclosed. One disclosed embodiment relates to a circuit that includes a tuned class D amplifier that receives an input signal and generates a pulsed RF output signal in response to the input signal. The pulsed RF output signal has a greater power than that of the input signal.

23 Claims, 11 Drawing Sheets

U.S. PATENT DOCUMENTS

| | | | |
|---|---|---|---|
| 6,304,137 | B1 | 10/2001 | Pullen et al. |
| 6,404,823 | B1 | 6/2002 | Grange et al. |
| 6,441,673 | B1 | 8/2002 | Zhang |
| 6,459,336 | B1 | 10/2002 | Luu |
| 6,462,620 | B1 | 10/2002 | Dupuis et al. |
| 6,687,380 | B1 | 2/2004 | Vishwamitra |
| 6,701,138 | B2 | 3/2004 | Epperson et al. |
| 6,754,287 | B2 | 6/2004 | Underbrink et al. |
| 6,763,114 | B1 | 7/2004 | Nalbant |
| 6,765,442 | B2 * | 7/2004 | Kane .................... 330/251 |
| 6,831,423 | B2 | 12/2004 | Chen |
| 6,856,199 | B2 | 2/2005 | Komijani et al. |
| 6,914,480 | B2 | 7/2005 | Arai et al. |
| 2003/0058039 | A1 | 3/2003 | Noro |
| 2004/0004517 | A1 | 1/2004 | Ruha et al. |
| 2004/0037363 | A1 | 2/2004 | Norsworthy et al. |
| 2004/0041545 | A1 | 3/2004 | Garabandic |
| 2004/0108900 | A1 | 6/2004 | Apel |
| 2004/0124915 | A1 | 7/2004 | Heubi et al. |
| 2004/0140848 | A1 | 7/2004 | Bayko |
| 2005/0218988 | A1 | 10/2005 | Berkhout |
| 2006/0001332 | A1 | 1/2006 | Ollila |
| 2006/0006934 | A1 | 1/2006 | Burns et al. |
| 2006/0006937 | A1 | 1/2006 | Burns et al. |
| 2006/0006939 | A1 | 1/2006 | Burns et al. |
| 2006/0170043 | A1 | 8/2006 | Liu et al. |

FOREIGN PATENT DOCUMENTS

WO    WO 2005/025065 A1    3/2005

OTHER PUBLICATIONS

S. Hintea, E. Simion and L. Festila, "Radio Frequency Link Used in Partially-Implanted Auditory Prosthesis", Electronics, Circuits and Systems, 1996, ICECS '96, Proceedings of the Third IEEE International Conference on RODOS, Greece, Oct. 13-16, 1996, New York, NY, USA, IEEE, US, pp. 1143-1146, vol. 2.

International Search Report and Written Opinion for International application No. PCT/US2007/023979 mailed May 8, 2008.

International Search Report and Written Opinion for International application No. PCT/US2007/023971 mailed Aug. 4, 2008.

\* cited by examiner

PULSE AMPLIFIER

RELATED APPLICATIONS

This application claims priority under 35 U.S.C. §119(e) to U.S. Provisional Application Ser. No. 60/866,147, entitled "Electronic Switch Network," filed on Nov. 16, 2006; U.S. Provisional Application Ser. No. 60/866,144, entitled "Distributed Multi-Stage Amplifier," filed on Nov. 16, 2006; and U.S. Provisional Application Ser. No. 60/866,139, entitled "Pulse Amplifier," filed on Nov. 16, 2006. Each of the foregoing applications is hereby incorporated by reference herein in its entirety.

BACKGROUND OF INVENTION

1. Field of Invention

This invention generally pertains to methods and devices for amplifying a signal. In certain aspects, it relates to power amplifiers and amplifier systems working at radio frequencies (RF) or higher. Applications include, but are not limited to, wireless systems, microwave components, power amplifiers, CMOS amplifiers, driver amplifiers, and portable electronics.

2. Discussion of Related Art

A common problem in power amplifier (PA) design is dealing with the breakdown limitations of the device technology. Most techniques for power amplification produce a peak voltage on the terminals of the device between two and four times the supply voltage. It is often desirable to tune the amplifier to create a peak voltage as high as possible to improve the efficiency of the amplifier. However, this peak voltage must stay well below the breakdown limits of the device technology. This creates a problem for technologies such as CMOS which have very low breakdown voltages. For example, in a wireless handset the supply voltage can be nominally 3.5V and the peak voltage for an efficient amplifier can be at least 7.0V. A 0.5 um CMOS process typically only has a breakdown voltage of 5.0V, making the technology unsuitable for the application.

A second problem can arise when a power amplifier is used to drive an antenna or other uncontrolled load impedance. In the case of an antenna, the PA might see a load impedance that varies by a factor of as much as ten. This can cause the PA to deviate from its nominal class of operation and produce peak voltages significantly higher than planned. For this reason, it may be desirable to use a device technology with a breakdown voltage of greater than four to five times the supply voltage.

Several techniques have been employed in the industry to avoid these problems. Multiple cascade stages have been used to reduce the voltage across any one transistor. Amplifiers can also be implemented in series with the supply to divide the voltage swing across two or more sets of transistors. Either of these techniques can solve the first problem but will struggle with the second issue of load tolerance. A DC-DC converter can also be used to control the supply voltage. However, this will have a significant impact on the cost of the system and may also struggle with the second problem.

Push-pull class D amplifiers have the advantage of keeping the voltage at or below the supply voltage for all conditions. While this solves the two major problems discussed, they have poor DC to RF conversion efficiency at RF frequencies. This is because the output capacitance of the two devices must be discharged each time the amplifier switches state. The resulting power loss is $2 \cdot \pi \cdot F \cdot C_{out} \cdot (V_{sw})^2$, where F is the switching frequency, $C_{out}$ is the output capacitance and $V_{sw}$ is the voltage across a switch upon switching. This power loss is proportional to the switching frequency, F, and is unacceptably high at RF for most commercially available device technologies.

One variant of this technique that retains the advantage of low peak voltages while producing high efficiency is the class DE amplifier. This was first suggested by Zhukov and Kozyrev in 1975. Its most widespread use has been for rectifiers for DC converters. The basic idea is to improve the efficiency of a class D push-pull amplifier by controlling the switching duty of the two devices. Typically, the biggest source of power loss in a push-pull amplifier at RF is the energy that is dissipated while charging the output capacitance of the devices during transitions. FIG. 1a shows a push-pull amplifier with the devices drawn as ideal switches with parasitic output capacitance. As the bottom switch transitions from the off state to the on state, it must discharge the full supply voltage present at its drain. Since these losses can be incurred in each cycle, the overall power dissipation caused by the bottom switch is $0.5 \cdot \omega \cdot C_n \cdot (Vsup)^2$ (where $\omega=2 \cdot \pi \cdot F$, $C_n$ is the parasitic output capacitance of the bottom switch, and Vsup is the supply voltage). A similar loss of $0.5 \cdot \omega \cdot C_p \cdot (Vsup)^2$ is incurred during the transition of the top switch. The total power loss incurred by both switches is thus represented by $\omega \cdot (C_n + C_p) V^2 = \omega \cdot C_{out} \cdot (Vsup)^2$. At RF frequencies this can be a significant loss in power and efficiency. The class DE amplifier can overcome this problem by switching the devices with independent signals and creating a period of time where both transistors are simultaneously off. A tuned output network can be used to provide the current necessary to discharge the output capacitance before the switch turns on. A diagram of this operation is shown in FIG. 1b. The class E condition of zero-voltage with zero-slope switching can be imposed to realize high efficiency. Efficiencies can be obtained that rival or surpass the techniques previously discussed while maintaining a peak voltage that is no greater than the supply voltage. Moreover, this circuit can be designed such that the peak voltage will never be higher than the supply, even under VSWR (Voltage Standing Wave Ratio) mismatch conditions. The penalties for this advantage can include a lower power density (a by-product of the lower peak voltage) and a more complex input drive. The low gain of most devices at RF and the complexity of the system have made realizing a class DE amplifier impractical at RF frequencies.

SUMMARY OF INVENTION

Exemplary methods and circuits capable of delivering a peak limited voltage pulse with sharp transitions, at any width and duty cycle, and with high efficiency are disclosed. At a duty cycle of 50%, for example, the output voltage waveform may resemble a square wave. Such a circuit is suitable as a driver stage for many different types of RF amplifiers, and in one embodiment it is used as a driver stage for a class DE amplifier.

In accordance with certain embodiments of the present invention, such a circuit may be designed to operate at RF frequencies with high DC to RF conversion efficiencies. Such a circuit can be realized using, but not limited to, the following technologies: silicon bipolar transistors, CMOS transistors, GaAs MESFETs, GaAs HBTs, GaAs PHEMTs. Such a circuit can also be compatible with the various IC manufacturing processes associated with the above technologies and can yield a monolithic solution.

According to one exemplary embodiment, a circuit can include a push-pull amplifier having a tuned load network connected to its output. The push-pull amplifier can have one or more switching devices. The tuned load network can be connected in parallel across the output, and can be configured such that the switching devices operate under substantially zero-voltage and/or zero-slope switching conditions. It also can be configured such that the output of the push-pull amplifier is not filtered and/or retains higher order harmonics, including harmonics sufficient to generate a trapezoidal, square wave, or any other non-sinusoidal waveform.

Another embodiment relates to a circuit that includes a tuned class D amplifier that receives an input signal and generates a pulsed RF output signal in response to the input signal. The pulsed RF output signal has a greater power than that of the input signal.

Yet another embodiment relates to a circuit for amplifying a signal. The circuit includes a class D amplifier and an input circuit. The input circuit provides pulsed input signals to drive the class D amplifier. At least two of the pulsed input signals have different duty cycles.

A further embodiment relates to a method of operating a class D push-pull amplifier to generate a pulsed output signal. The class D push-pull amplifier includes a push transistor and a pull transistor. The push transistor is driven with a first input signal having a first duty cycle. The pull transistor is driven with a second input signal having a second duty cycle. The first and second duty cycles of the first and second input signals are controlled such that the pulsed output signal has a desired duty cycle.

BRIEF DESCRIPTION OF DRAWINGS

In the drawings, each identical or nearly identical component that is illustrated in various figures is represented by a like numeral. These drawings are not necessarily drawn to scale. For purposes of clarity, not every component may be labeled in every drawing. In the drawings.

DETAILED DESCRIPTION

Figure 1A:
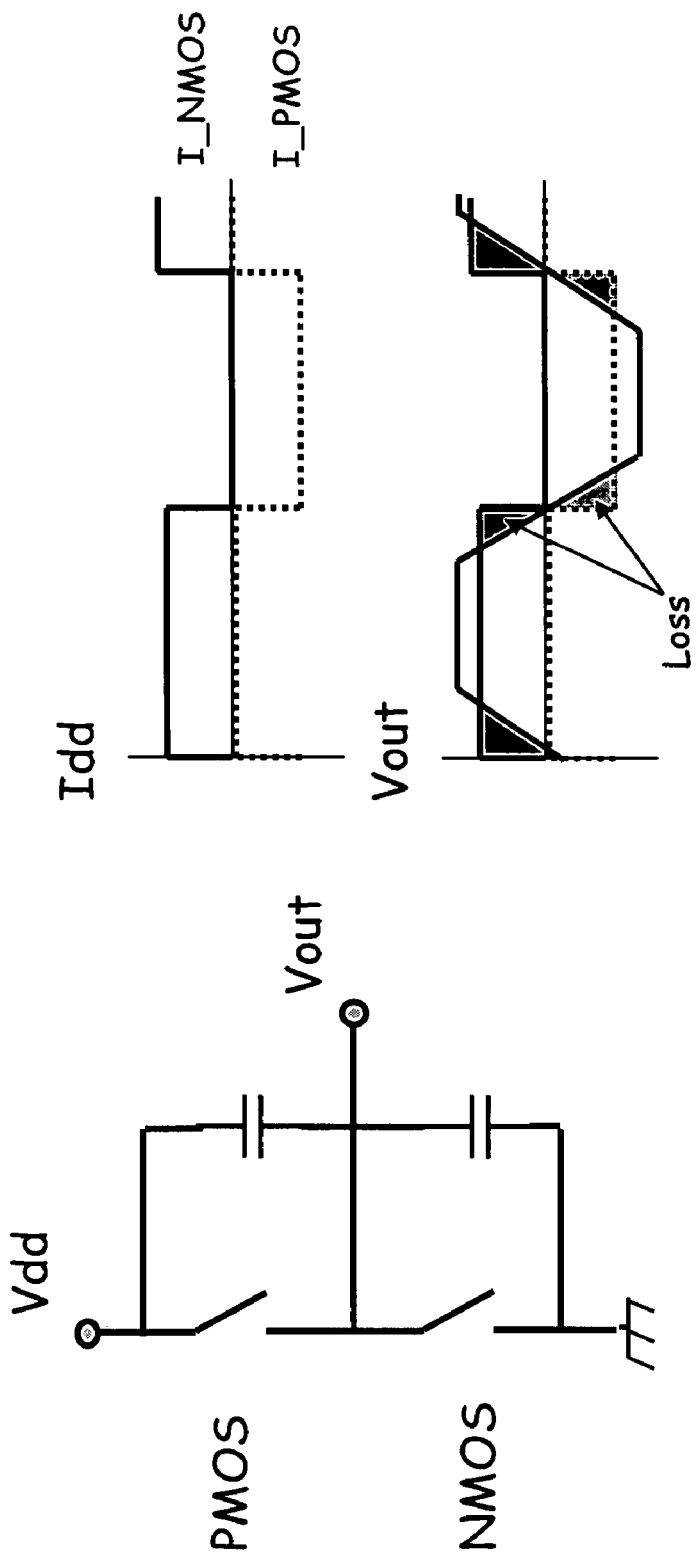
FIG. 1a shows a push-pull class D amplifier power stage.
Figure 1B:
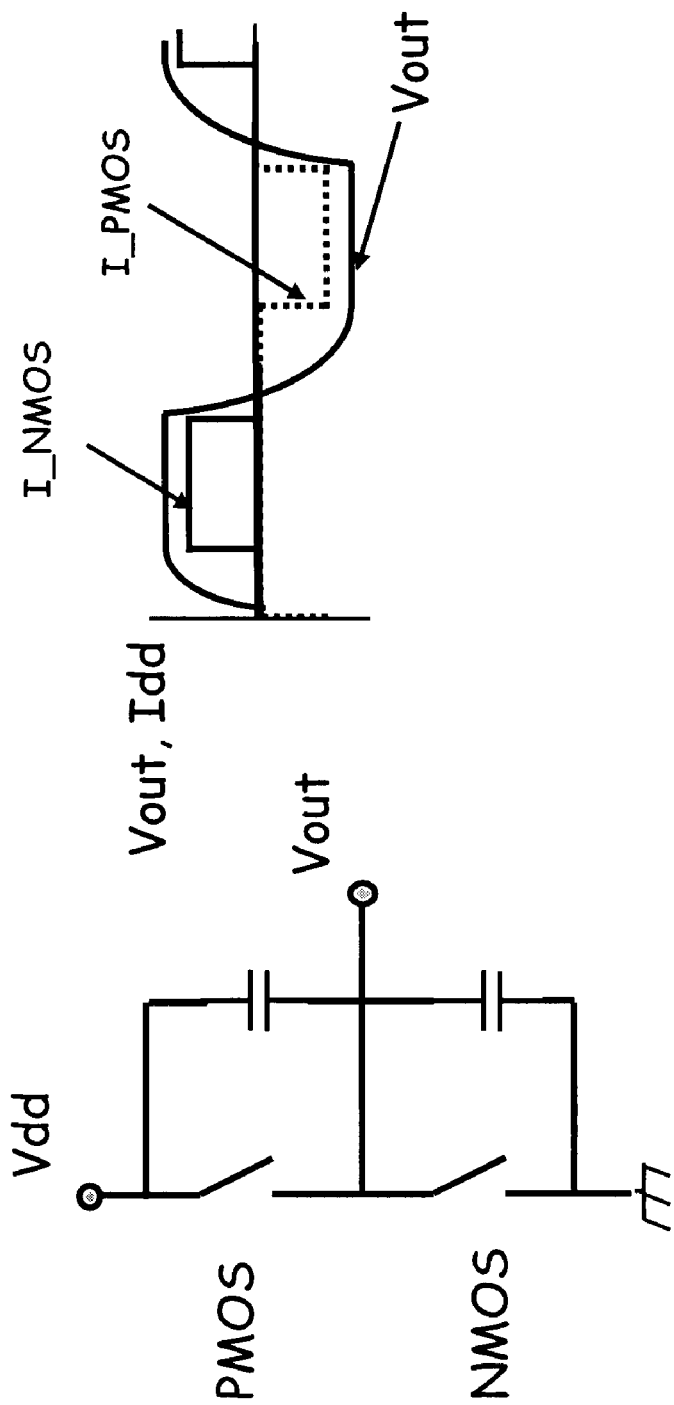
FIG. 1b shows a common amplifier stage.
Figure 1C:
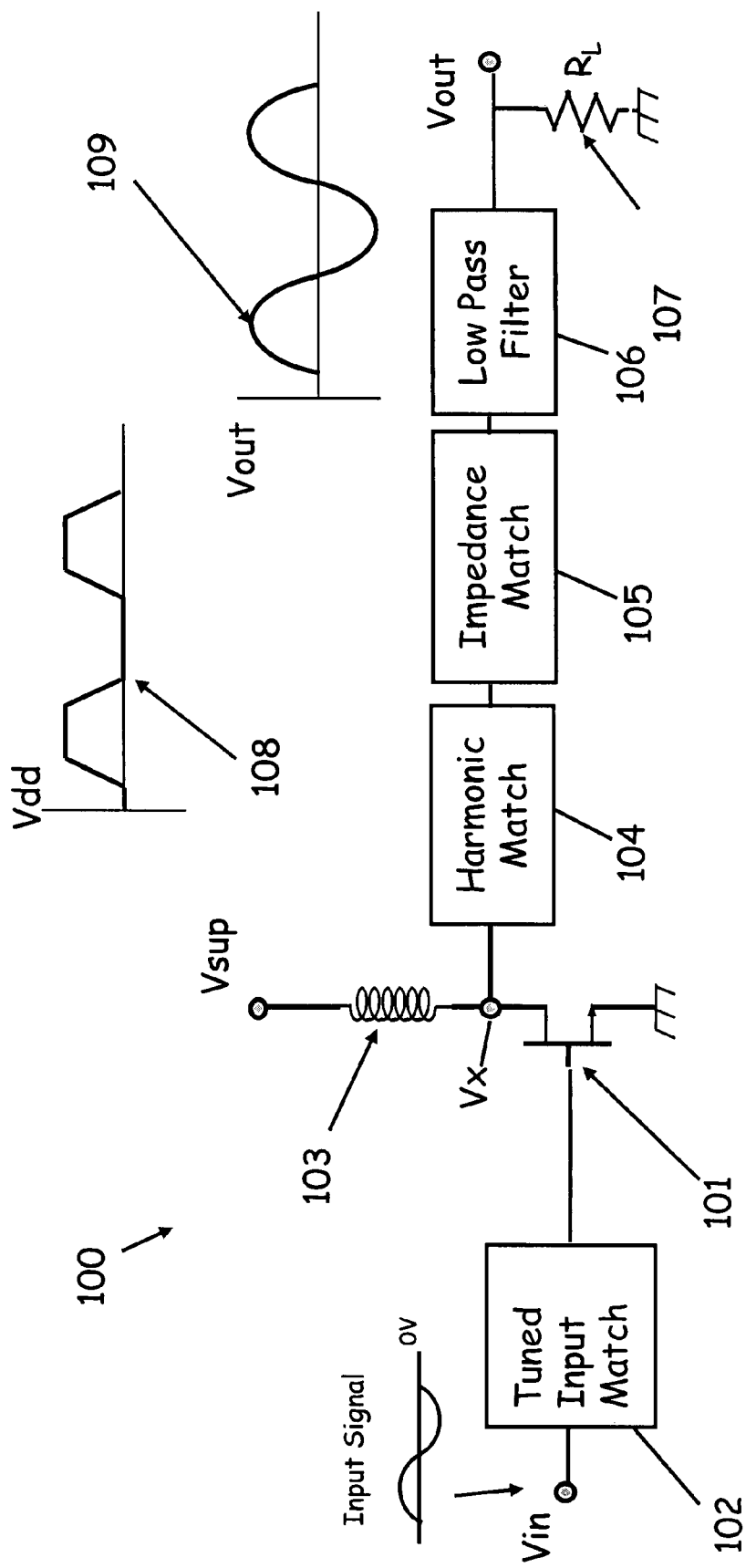
FIG. 1c shows another common RF amplifier stage.

FIG. 1c shows the configuration and associated waveforms for a common RF amplifier stage. An applied input signal is passed through a tuned input matching network 102 that filters the applied input signal and adjusts the relative impedances so as to optimize gain. Transistor 101 amplifies the input waveform to create a larger output signal. The amplifier 100 may be designed to operate in the linear region or in the saturated region so as to produce high DC to RF conversion efficiency. In the latter case, the voltage waveform 108 at node Vx will take on various characteristics according to the mode of operation used for the design. For class F amplifiers, the voltage waveform 108 at node Vx typically will approximate a square wave signal with a peak of 2·Vsup. Class E and other tuned modes generally produce peak voltages that are higher. Push-pull amplifiers will have a peak voltage which is substantially equal to the supply voltage Vsup. The output signal in push-pull amplifiers usually has a duty cycle of 50%. The mode of operation for the amplifier is determined by the design of elements 103, 104, 105, and 106. As shown, bias inductor 103 is used to isolate the supply voltage Vsup from transistor 101 and enables the peak voltage of Vx to exceed the supply voltage Vsup. Harmonic match 104 is used to match the impedances at the harmonics or the frequency of operation. This is principally responsible for setting up the mode of operation for the amplifier. For example, a class F amplifier might have even harmonics set to be short circuits, or zero-Ohm impedances, and odd harmonics set to open impedances, or infinite-Ohm impedances. The impedance match 105 can transform the system impedance used for best performance of the transistor to the load impedance $R_L$ 107. The low pass filter 106 can be used to filter the harmonics of the signal and is generally either required by or a result of the class of operation. In this type of amplifier, elements 103-106 operate to heavily filter output waveform 109 at Vout such that it approaches a sine wave with 50% duty cycle. This type of waveform is undesirable for driving many output stage amplifiers, including a class DE stage.

Figure 2:
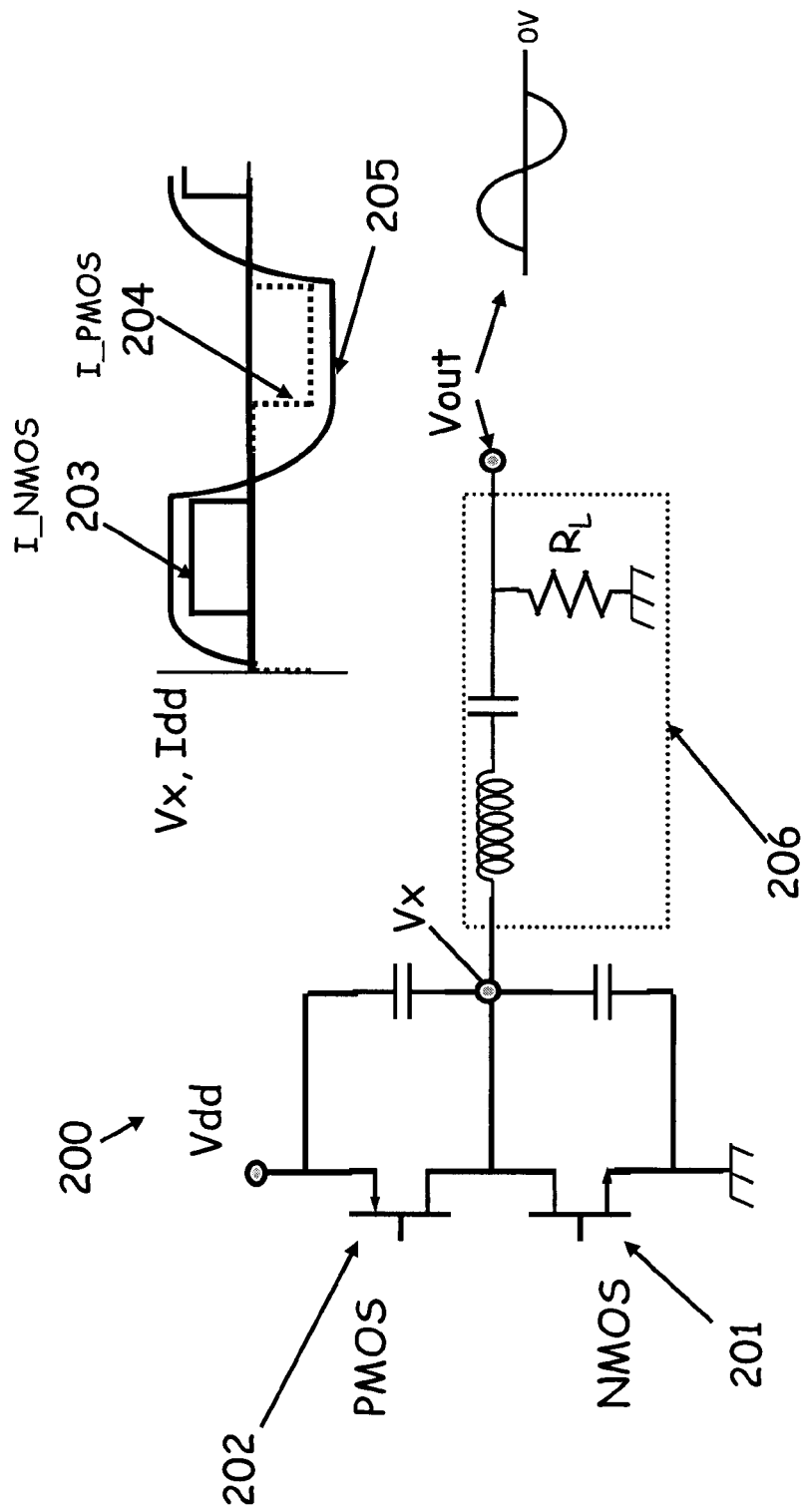
FIG. 2 shows the operation of a class DE stage having a filtered output.

Exemplary operation of a class DE stage is depicted in FIG. 2, which shows circuit 200. As shown, transistors 201 and 202 are configured to operate similar to a push-pull amplifier. Higher DC to RF conversion efficiency than a standard push-pull class D amplifier is achieved, however, by turning off each stage prior to turning the other stage on. This creates a period of time where both devices are off, allowing the voltage at the common node to fully discharge before current flows in the devices. The waveforms 203 and 204 represent the current through transistors 201 and 202. At all other times the device is turned off. The waveform 205 shows the voltage at the common terminal Vx. Careful design of the tuned load network 206 will ensure that each transistor turns on with zero current and voltage across its terminals. Each transistor can be operated with non-overlapping duty cycles of less than 50% and with precise control of the timing to achieve class DE operation. This may be achieved by driving each transistor with digitally generated pulse width modulated signals. However, this is not practical at RF frequencies with the power levels necessary to drive an output stage. The class DE amplifier is also usually only practical if the efficiency of the driver stage does not degrade the overall amplifier efficiency.

Figure 3:
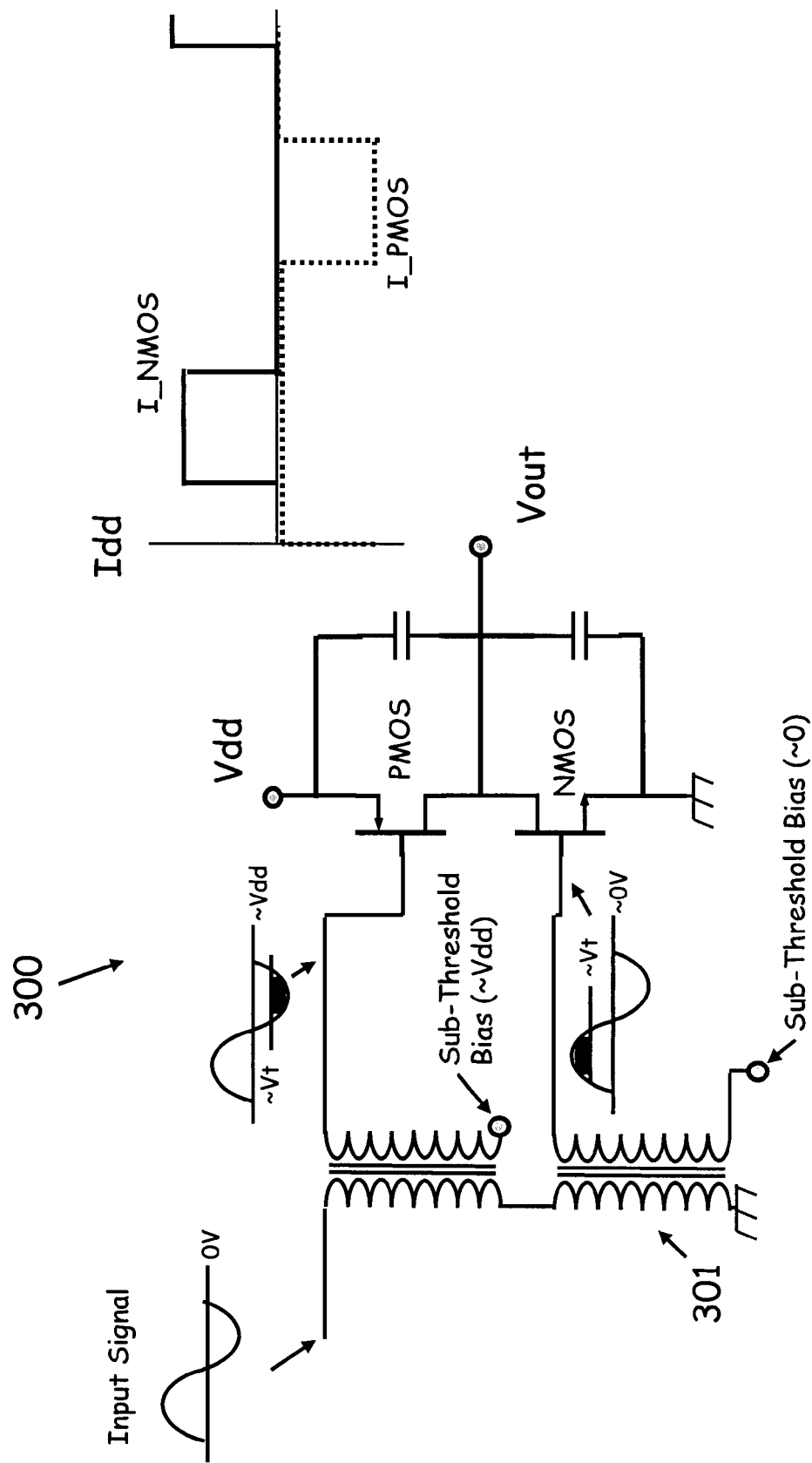
FIG. 3 shows a class DE amplifier stage that is driven using a sinusoidal input signal provided by a transformer.

FIG. 3 shows a circuit 300 that illustrates how a class DE amplifier can be configured to operate from a sine wave drive signal provided by a transformer. Here, a transformer 301 is used to isolate the DC level for the two transistors of the push-pull stage. The transistors are then biased at or below threshold so that the amplifier has less than a 50% duty cycle. This solution may create several problems. In particular, the sub-threshold bias will further reduce the gain of the output stage devices. The resulting waveforms at the gates of the transistors may also exceed certain breakdown requirements for the devices, which will require the addition of diodes or other protection circuitry, further reducing gain and increasing complexity.

A U.S. Patent Application filed on even date herewith and entitled "Distributed Multi-Stage Amplifier" describes a circuit and method for driving a push-pull amplifier that provides efficient class DE operation of the amplifier at or above RF frequencies. As described herein, such a circuit or method may benefit from the capability of creating pulsed drive waveforms with variable duty cycles at high efficiencies.

Figure 4:
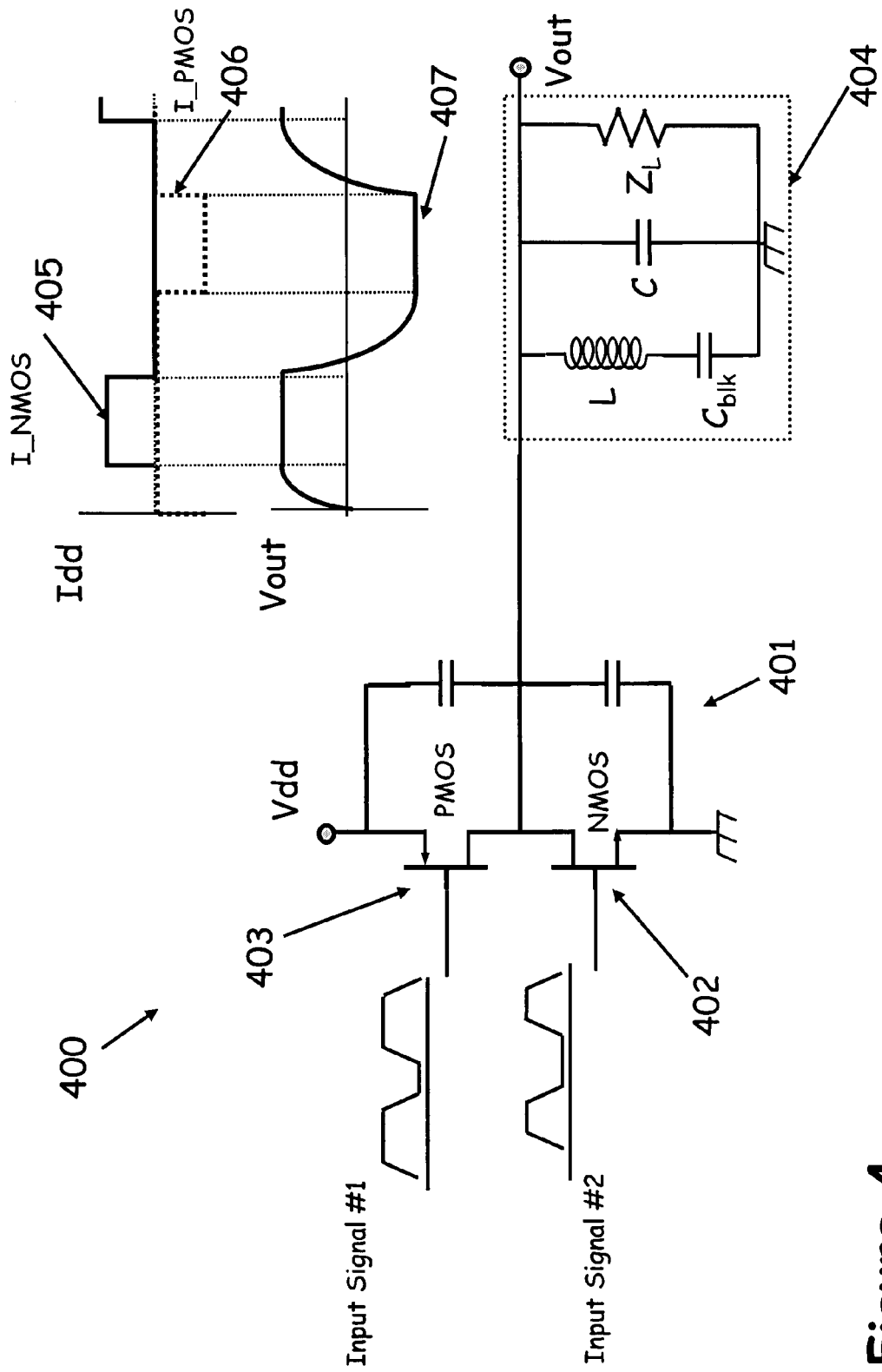
FIG. 4 shows a circuit capable of creating pulsed drive waveforms in accordance with an exemplary embodiment of the invention.

FIG. 4 shows a circuit 400 capable of creating pulsed drive waveforms in accordance with an exemplary embodiment of the invention. The circuit is capable of generating the drive waveforms with sufficient power and with high DC to RF conversion efficiency. As shown, the driver stage 401 is configured to operate similar to a standard class DE amplifier. Transistors 402 and 403 are connected between ground and Vdd (a constant supply voltage). Transistors 402 and 403 are configured in a push-pull topology and are driven such that each transistor is turned off prior to the other being tuned on. The combination of transistors 402 and 403 may be referred to as an inverter. FIG. 4 shows the current waveforms 405 and 406 for transistors 402 and 403, respectively.

In a standard class DE amplifier, the push-pull transistors typically drive a series resonant circuit designed to discharge the output capacitance during the time when both transistors are in the off state. The circuit of FIG. 4 may differ from a standard class DE amplifier with respect to the output matching network 404. In the output matching network 404, this series combination described above can be replaced with a shunt network comprising an inductor in series with a blocking capacitor $C_{blk}$. If the capacitor is large enough, it can function as a voltage supply with a potential equal to the average voltage seen at Vout and serve to supply the inductor current. An additional capacitor C may be added to provide further design flexibility or reflect any output capacitance present in the load. As shown, the output matching network 404 also takes into account the load impedance ZL, e.g., for impedance matching purposes. The load impedance ZL can represent any type of load that the amplifier circuit can be driving, for example, a transistor, an amplifier stage, an antenna, an output conditioning circuit, etc. Techniques for the selection of a suitable output matching network 404 will be discussed below.

A desired duty output duty cycle Ds may obtained by selecting the OFF time φ according to equation [2] shown below. As illustrated in equation [1], the OFF time φ may be selected sufficiently low such that the transistors can supply the desired peak output current $I_{peak}$, given a switching frequency ω=2πF, output capacitance Cout, and supply voltage Vdd. As illustrated in equations [3] shown below, OFF time φ may be selected to be high enough such that there is sufficient time for a transition to occur during the OFF time φ such that the transition is completed by the time that switching occurs, thereby achieving a high efficiency of the pulse amplifier. Equations [3] can be used to determine a sufficient OFF time φ, given a an output capacitance Cout, and load resistance R.

$$I_{Peak} = \frac{\omega C_{out} V_{DD}}{1 - \cos\phi} \quad [1]$$

$$Ds = \frac{\pi - \phi}{2\pi} \quad [2]$$

$$R' = \frac{\sin^2 \phi}{\pi}, \quad R = \frac{R'}{\omega C_{out}} \quad [3]$$

$$X' = \frac{\phi - \sin\phi \cos\phi}{\pi}, \quad X = \frac{X'}{\omega C_{out}} \quad [4]$$

The duty cycle Ds and inductance L can be chosen such that the pulse amplifier 400 has a DC to RF conversion efficiency equal to that of a standard class DE amplifier. The inductance L, capacitance $C_{blk}$ and/or C, and output duty cycle Ds can be chosen such that each transistor will turn on with zero voltage across its terminals and while the change in voltage is at zero slope. As shown in FIG. 4, the output voltage waveform 407 present at the output terminal Vout is unfiltered and retains properties close to a square wave. In some circumstances, the output waveform can resemble a slight trapezoid due to the charging time for the output capacitance, but can be near ideal for driving a switch amplifier stage. In practice, the transitions may be faster than illustrated in FIG. 4, as FIG. 4 is not drawn to scale for the sake of illustration.

The choice of load network components and the duty cycle of the transistors depends on how much output capacitance is to be discharged and how much current can be supplied by the transistors. Once the OFF time φ has been selected, a suitable reactance X may be selected using equation [4] shown above. In the output matching network 404 shown in FIG. 4, X is the reactance of the series L-$C_{blk}$ combination (optionally including shunt capacitance C) at the operating frequency. This reactance, a net inductance, can be used to draw current from the output capacitance of the transistors to discharge the voltage during the time when both transistors are off. In some cases, the optimum value of inductance should be close to or equal to the value Cout·Vdd²/$I_{peak}^2$, where Cout includes the output capacitance of the transistors plus any capacitance present in the load network, Vdd is the supply voltage, and $I_{peak}$ is the peak output current. In the absence of a complete analytical workup, the performance can be refined through optimization. It should be noted that the output matching network 404 is not limited to the particular arrangement of circuit elements shown, but can have a wide variety of elements, including inductors, capacitors, and resistors, in series and parallel arrangements, including a wide array of equivalent circuits, as a suitable reactance X may be obtained in a variety of different ways. The type of output matching network selected may be suitable to efficiently discharge the parasitic capacitances of the transistors without filtering the output signal, thereby resulting in a pulsed output voltage waveform 407.

Pulsed output voltage waveform 407 can be useful for driving an amplifier stage that requires a square wave signal with a 50% duty cycle. However, a class DE output stage usually drives signals with duty cycles of greater than or less than 50%. The pulse amplifier 400 can accomplish this through careful selection of the duty cycles of the input signals. The duty cycles of the input signals can be selected using known amplifier design techniques, and also taking into account the equations [1] and [2] above. These equations are based on the energy needed to discharge the capacitors in terms of the peak current and the duty cycle of each stage. An aspect to consider in selecting the duty cycles is the amount of time, φ, where each transistor is in the OFF state. If this time φ is selected to be sufficiently large, the load network will discharge the output capacitance with zero-voltage, zero-voltage-slope and/or zero-current. To change the output duty voltage duty cycle Ds, the duty cycle of one of the transistors may be changed while decreasing the duty cycle of the other transistor by the same amount, thus holding the OFF time φ constant. For example, the duty cycle of the PMOS transistor may be increased to increase the output duty cycle Ds. When increasing the duty cycle of the PMOS transistor, the duty cycle of the NMOS transistor may be decreased by the same amount that the duty cycle of the PMOS transistor is increased, thus keeping the OFF time φ constant. By keeping the OFF time φ constant at the selected value, the load network may discharge the output capacitance with zero-voltage, zero-voltage-slope and/or zero-current regardless of the individual duty cycles of the push-pull transistors, which may be changed to produce an output signal with a desired duty cycle.

Figure 5:
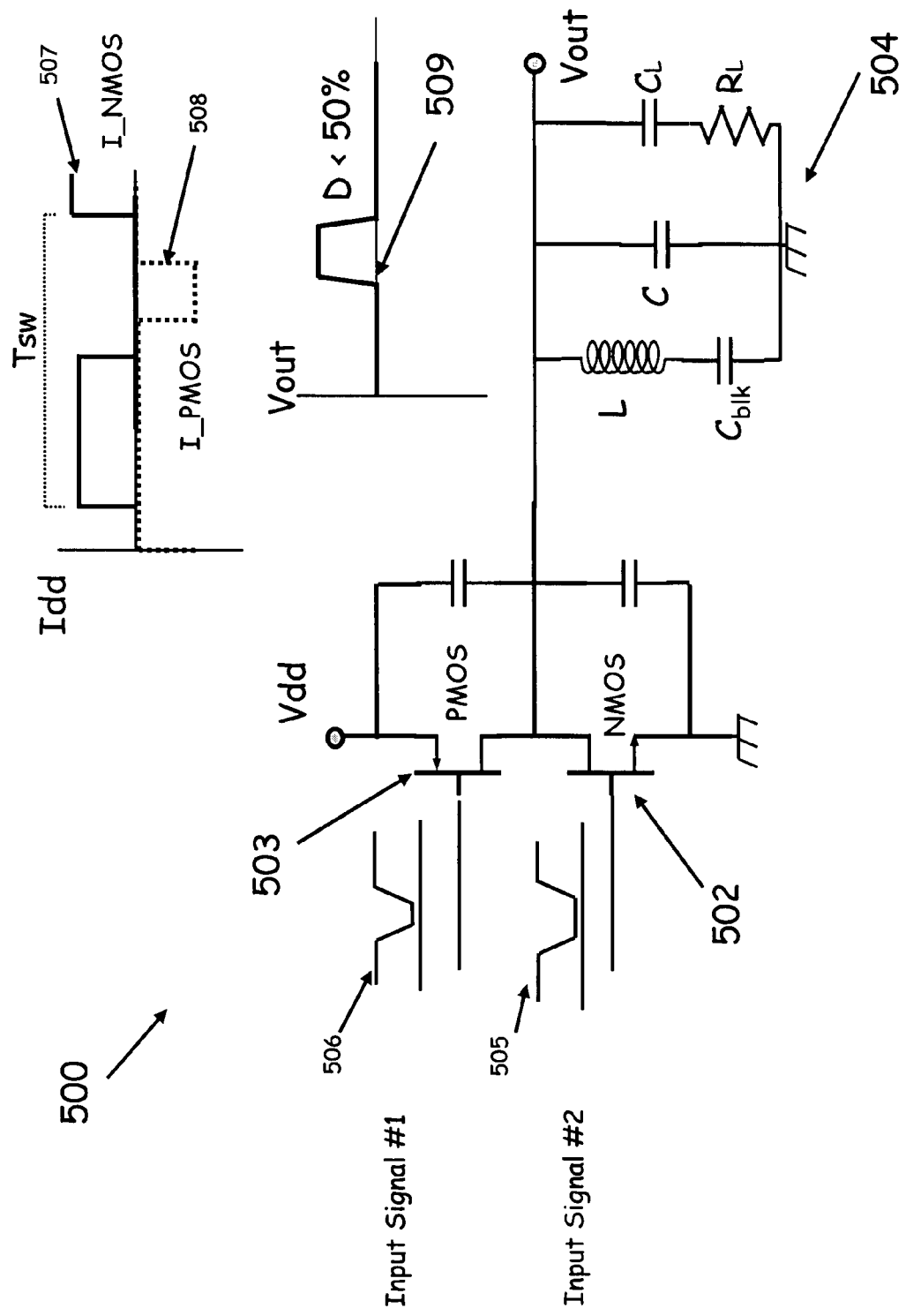
FIG. 5 shows the circuit of FIG. 4 operated so as to produce an output waveform having a duty cycle of less than 50%, according to one embodiment.

FIG. 5 illustrates another embodiment of the invention wherein a circuit 500 is operated so as to produce an output waveform having a duty cycle of less than 50%. As shown, input signal 505 drives the NMOS "pull" transistor 502 and is chosen to have a duty cycle of greater than 50%, and input signal 506 drives the PMOS "push" transistor 503 and is chosen to have a duty cycle of less than 50%. The time when both transistors are in the OFF state, φ, can remain the same as in a standard class DE amplifier. The components in output load network 504 can be chosen to properly discharge the output capacitance during the OFF time, φ. Waveforms 507 and 508 show the currents in transistors 502 and 503, respectively. Waveform 509 shows the resulting output voltage having less than a 50% duty cycle and characterized by sharp transitions.

Sharp transitions include transitions that occur quickly compared to the switching period Tsw, which is the inverse of the switching frequency. For example, if the voltage at Vout transitions from zero to Vdd, the transition may occur in a small fraction of switching period, such as less than 5% of Tsw, less than 2% of Tsw, or less than 1% of Tsw. However, the transition time fraction of Tsw is only one metric for determining whether a transition is sharp, and it should be appreciated that sharp transitions may be characterized by different metrics. If transition time is used as such a metric, the transition time may be measured in any suitable way, such as the amount of time the signal takes to transition from 10% to 90% of the change in signal value, for example. The transitions may be sharp enough that the waveform of pulsed signals appear to have a trapezoidal shape or the waveform of a square wave, when viewed on the time scale of about the switching period Tsw.

Figure 6:
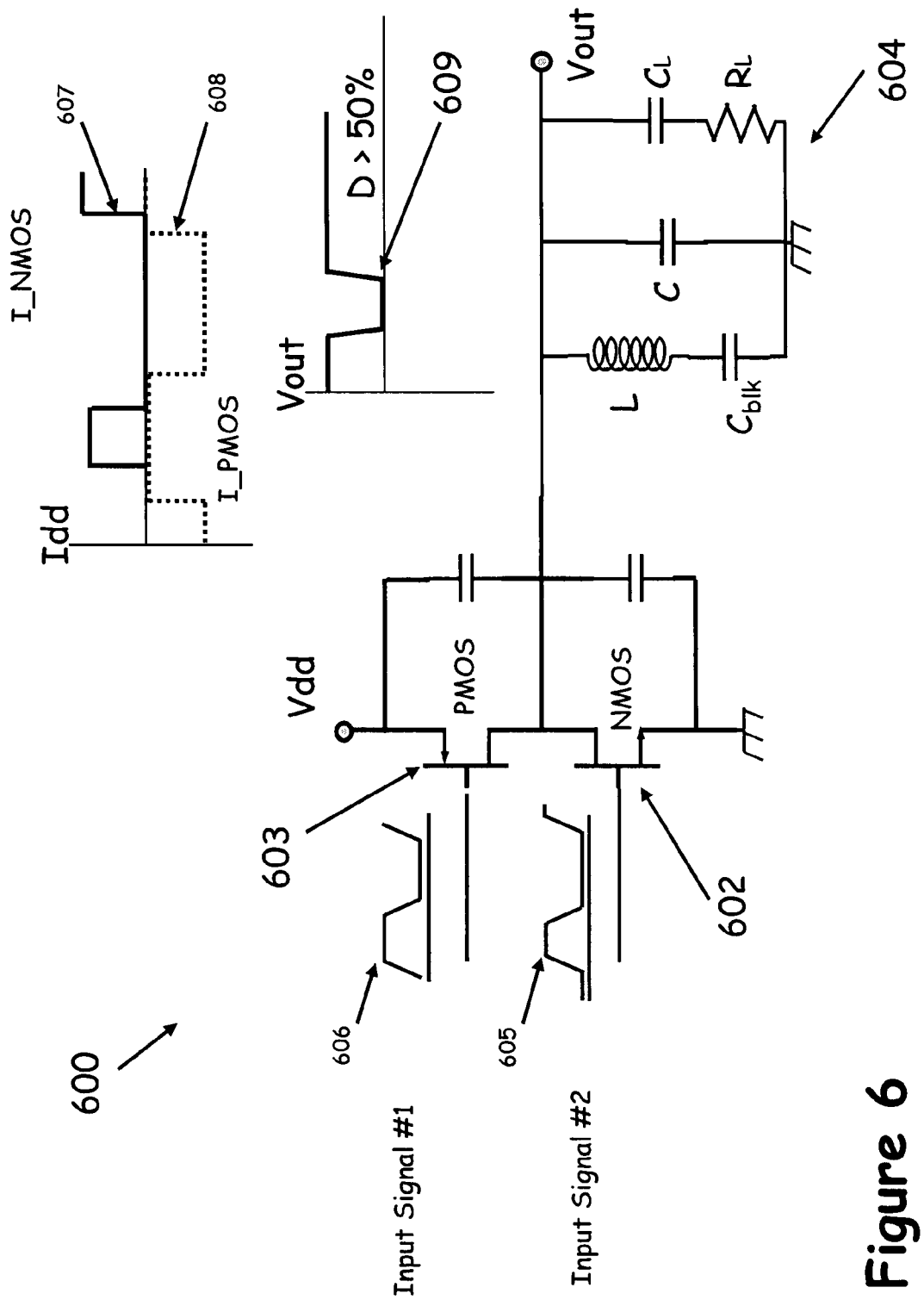
FIG. 6 shows the circuit of FIG. 4 operated so as to produce an output waveform having a duty cycle of greater than 50%, according to another embodiment.

FIG. 6 illustrates a further embodiment of the invention wherein a circuit 600 is operated so as to produce an output waveform having a duty cycle of greater than 50%. As shown, input signal 605 drives the NMOS "pull" transistor 602 and is chosen to have a duty cycle of less than 50%, and input signal 606 drives the PMOS "push" transistor 503 and is chosen to have a duty cycle of greater than 50%. The time when both transistors are in the OFF state, φ, can remain the same as in a standard class DE amplifier. The components in output load network 604 can be chosen to properly discharge the output capacitance during the OFF time, φ. Waveforms 607 and 608 show the currents in transistors 602 and 603, respectively. Waveform 609 shows the resulting output voltage having greater than a 50% duty cycle and characterized by sharp transitions.

It should be noted that the output networks 504 and 604 differ from output network 404. In particular, load impedance ZL has been replaced with a series resistor (RL) and capacitor (CL) to approximate the input impedance of a CMOS device. An additional shunt capacitance (not shown) can also be present to represent the parasitic capacitance of the driving amplifier and/or the load. This more closely represents the case when the pulse amplifier is used as a driver stage.

Figure 7:
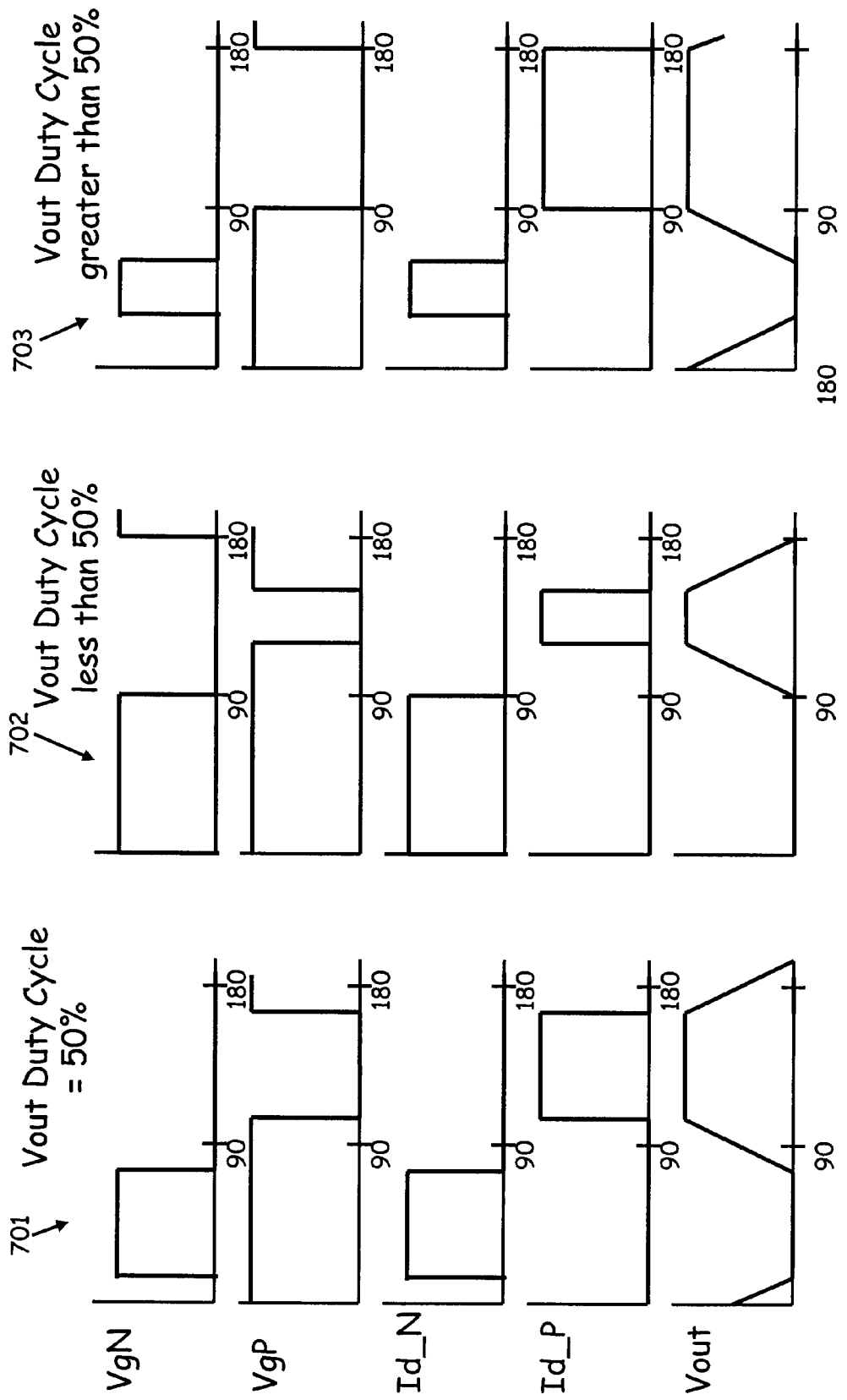
FIG. 7 shows exemplary timing diagrams for input producing signals with varying duty cycles that may be used to drive a pulse amplifier, according to one embodiment.

FIG. 7 shows waveforms for various signals of the embodiments illustrated in FIGS. 4-6. Waveforms are shown for the NMOS transistor gate voltage VGN, the PMOS transistor gate voltage VGP, the drain current Id_N through the NMOS transistor, the drain current Id_P through the PMOS transistor, and the voltage Vout. Each of the columns in FIG. 7 shows waveforms aligned to show the timing of various signals with respect to one another. Waveforms 701 illustrate various signals of circuit 400 as illustrated in FIG. 4, operated so as to produce an output duty cycle of 50%. Waveforms 702 illustrate various signals of circuit 500 illustrated in FIG. 5, operated so as to produce an output duty cycle of less than 50%. Waveforms 703 illustrate various signals of circuit 600 as illustrated in FIG. 6, operated so as to produce an output duty cycle of greater than 50%. Each of circuits 400, 500 and 600 has the same OFF time φ. The waveforms shown in FIG. 7 illustrate that for a given OFF time φ, increasing the ON time for the PMOS transistor increases the duty ratio of the output voltage Vout. The OFF time φ can be held constant by decreasing the ON time for the NMOS transistor by the same amount that the ON time for the PMOS transistor is increased. Increasing the ON time for the PMOS transistor in this manner will result in an increase in the duty cycle of the output voltage Vout, and conversely. For example, waveforms 702 show a relatively small ON time for the PMOS transistor, as illustration by the relatively small duration of the trough in the VGP waveform, which results in a relatively small duty cycle of the output voltage. Waveforms 701 and 703 show larger ON times for the PMOS transistor, resulting in larger duty cycles of the output voltage.

Figure 8:
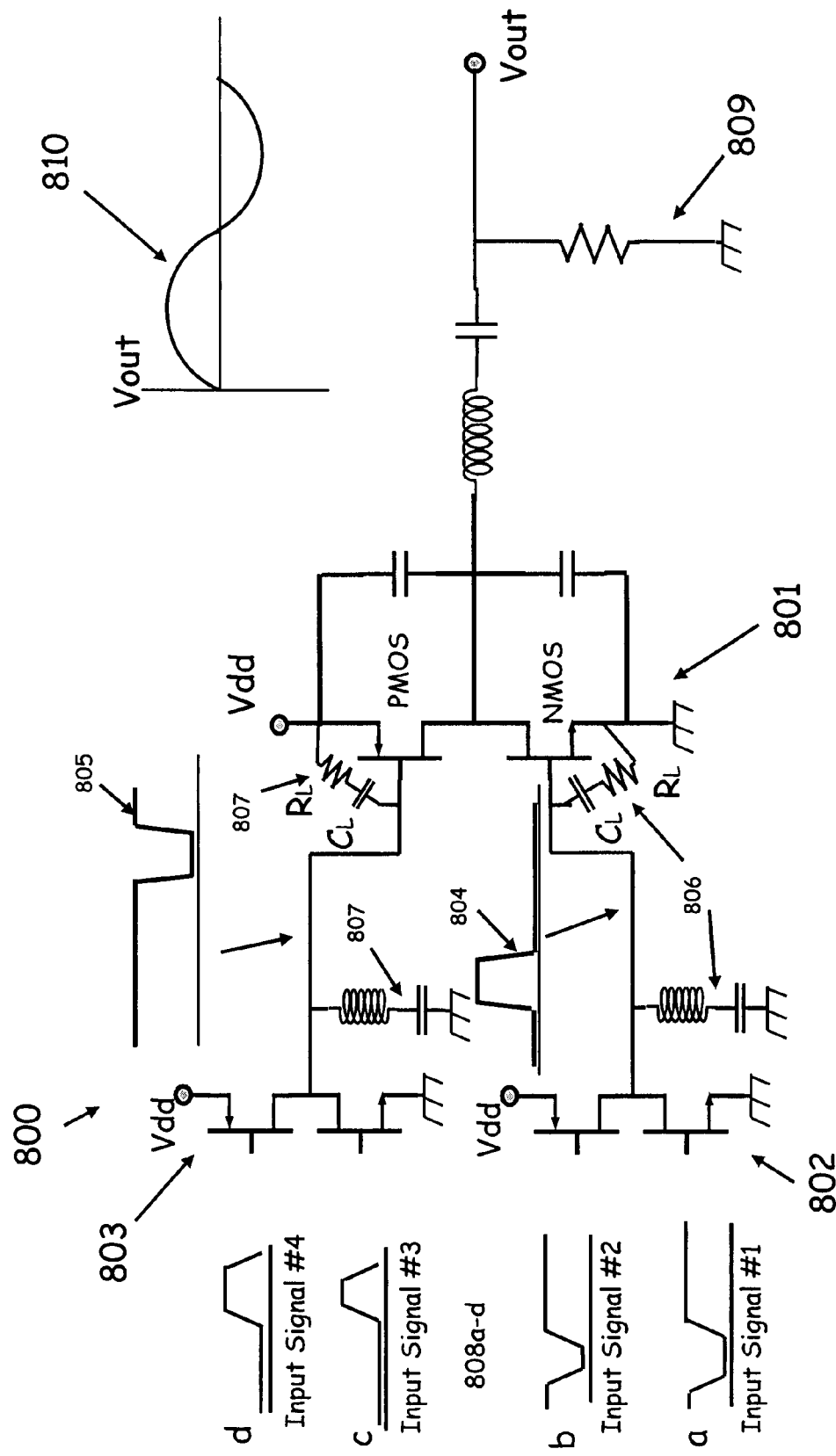
FIG. 8 shows how two pulse amplifier circuits can be used to drive a class DE output stage, according to some embodiments.

FIG. 8 illustrates an exemplary amplifier circuit 800, and demonstrates how two pulse amplifiers 802 and 803 can be configured to drive a class DE output stage 801. As shown, pulse amplifier 802 is configured to drive the NMOS "pull" transistor of class DE output stage 801. Input signals 1 and 2 can be chosen so that pulse amplifier 802 produces an output waveform 804 with a duty cycle of less than 50% and equal to the desired duty cycle for the desired operation of output stage 801. As shown in FIG. 8, an output load network 809 is coupled to the output of class DE output stage 801 with components chosen to ensure class DE operation and produce the filtered output waveform 810. Pulse amplifier 803 is configured to drive the PMOS "push" transistor of class DE output stage 801. Input signals 3 and 4 can be chosen so that pulse amplifier 803 produces an output waveform 805 with duty cycle greater than 50% and equal to the desired duty cycle for the desired operation of output stage 801. Each pulse amplifier has a load network 806, 807, comprised of the intrinsic parasitic impedance (represented in FIG. 8 by capacitor CL in series with resistor RL) of the device in the class DE amplifier, and a shunt inductor with a by pass capacitor. The by pass capacitor may present the shunt inductor with a virtual ground by virtue of the by pass capacitor's connection to true ground. However, the invention is not limited as to the particular topology or arrangement of components of the load network. Load networks 806 and 807 can be designed to enable zero-voltage-zero-current switching of the driver stage transistors, resulting in high efficiency for the complete amplifier circuit.

In the embodiments described herein, for a desired output duty cycle, the duty cycles of the input pulses to the pulse amplifier may be selected so as to maximize efficiency. For example, the total OFF time φ may be held constant while the duty cycles of the input signals are adjusted accordingly to maximize efficiency. Under some conditions, an efficiency of greater than 70% may be achieved using the techniques described herein, however the invention is not limited in this respect, as the efficiency achieved may be higher or lower. In some implementations the efficiency may be at least 50%, while some implementations may achieve an efficiency of greater than 80% or even 90%. As used herein, the term efficiency refers to the ratio of input power to output power.

Figure 9:
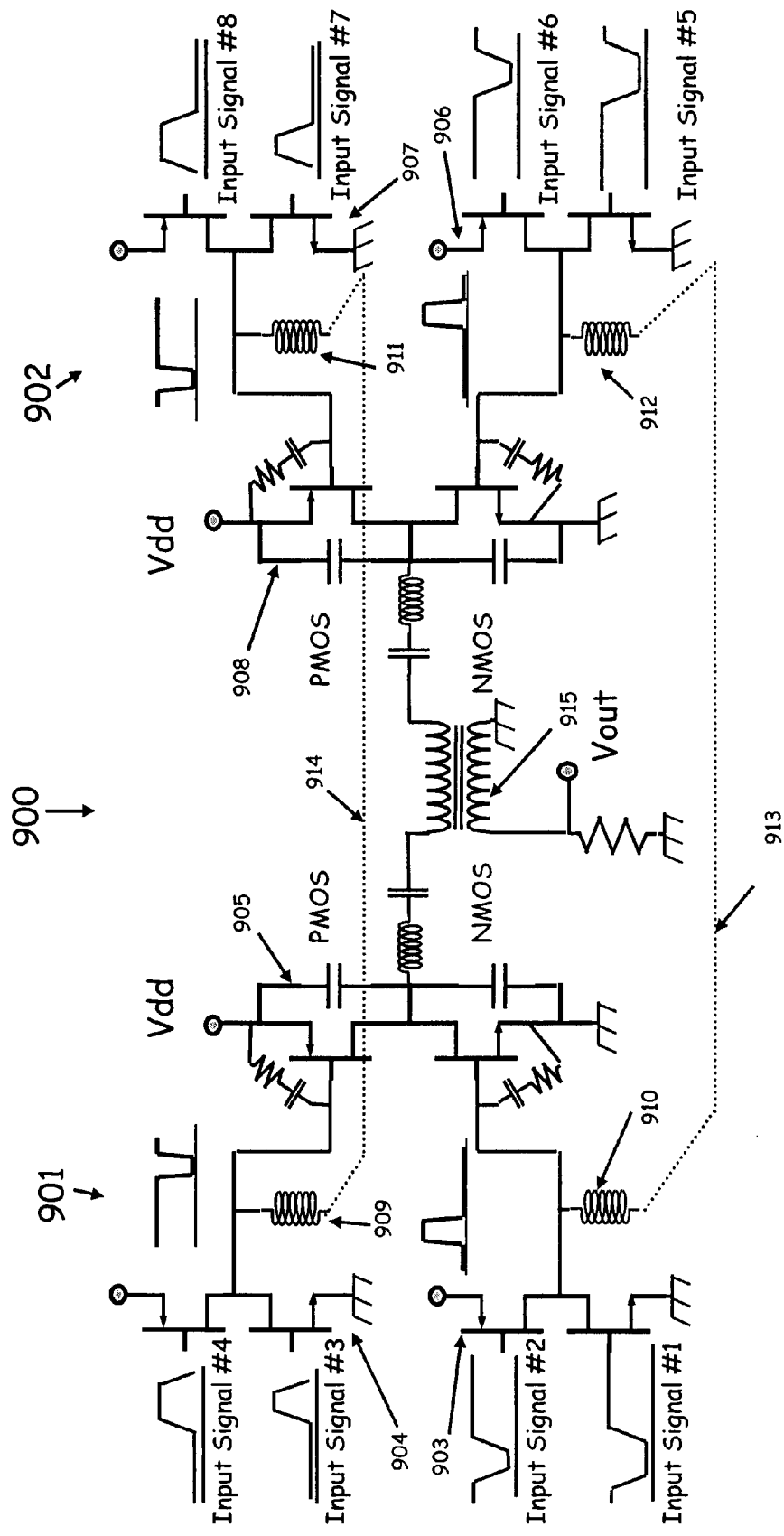
FIG. 9 shows the circuit of FIG. 8 configured to function differentially, according to some embodiments.

FIG. 9 shows a circuit 900 that is configured to function differentially, according to another embodiment. This circuit addresses a problem that may arise as a result of the capacitance of the large blocking capacitors shown in series with the shunt inductors in load networks 404, 504, 604, 806, and 807. The capacitance of these capacitors typically must be large enough so that the impedance of the capacitor is significantly less than that of the inductor, e.g., much greater than ten times less. However, such a capacitance may be inconsistent with semiconductor manufacturing processes. This difficulty can be overcome by implementing the full amplifier circuit in a differential manner. FIG. 9 shows a circuit 900 similar to the 2-stage amplifier circuit of FIG. 8, but which has been split into two halves and driven 180° out of phase. As shown, the circuit 900 comprises two 2-stage class DE amplifiers 901 and 902. Amplifier 901 includes two pulse amplifier drivers 903 and 904, each with separate load network 909 and 910, and output class DE stage 905. Amplifier 902 includes two pulse amplifiers 906 and 907, each with separate load networks 911 and 912, and an output class DE stage 908. Input signals 1-4 can be chosen so as to drive pulse amplifiers 903 and 904 consistent with the operation described in FIGS. 5 and 6 respectively. Input signals 5-8 can be chosen so as to be identical to input signals 1-4 respectively, but phase shifted by 180°. This may result in operation identical to amplifier 901 and consistent with a previously described embodiment of the invention, but wherein the generated waveforms are 180° out of phase with the waveforms generated by amplifier 901. As shown, output waveforms from amplifiers 901 and 902 are, as a result, 180° out of phase with each other and can be combined using a balun 915 to produce an output signal with twice the power of a single two-stage amplifier alone. Load networks 909 and 911 can be coupled together via connection 914. Because pulse amplifiers 904 and 907 operate 180° out of phase, connection 914 becomes a virtual ground. The by pass capacitors shown in the embodiments of FIGS. 4, 5, and 6 can thereby be eliminated. Likewise, load networks 910 and 912 can be coupled via connection 913, creating a virtual ground and eliminating further by pass capacitors.

As discussed above, the techniques of the present application and those described in a U.S. Patent Application filed on even date herewith entitled "Distributed Multi-Stage Amplifier" may advantageously be used in combination with one another for providing efficient amplification. However, these techniques need not be used together and can be utilized separately, as the invention is not limited in this respect.

Some of the techniques described herein relate to operating an amplifier in a class DE mode of operation. However, in some circumstances a sufficiently high efficiency can be achieved by operating a class D amplifier in a manner that is close to class DE operation but not "true" class DE operation. For example, a relatively small voltage and/or current may be present at the terminals of a transistor upon switching, but the resultant power loss may be acceptably small. Such techniques are within the scope of this disclosure.

Having thus described several aspects of at least one embodiment of this invention, it is to be appreciated various alterations, modifications, and improvements may be made within the spirit and scope of the invention. Accordingly, the foregoing description and drawings are by way of example only.

What is claimed is:

1. A circuit, comprising:
  a tuned class D amplifier that receives at least one input signal and generates a pulsed RF output signal in response to the at least one input signal, the pulsed RF output signal having a power greater than a power of the at least one input signal;
  wherein the pulsed RF output signal is a microwave signal.

2. The circuit of claim 1, wherein the tuned class D amplifier comprises a push-pull amplifier.

3. The circuit of claim 2, wherein the push-pull amplifier comprises an inverter.

4. The circuit of claim 3, wherein the inverter comprises a first transistor coupled to a first supply voltage and a second transistor coupled to a second supply voltage.

5. The circuit of claim 4, wherein the first and second transistors are complementary to one another.

6. The circuit of claim 4, wherein the first transistor is a PMOS transistor and the second transistor is an NMOS transistor.

7. The circuit of claim 1, further comprising a load network coupled to the output of the tuned class D amplifier and having an impedance selected such that the tuned class D amplifier is tuned to operate in a class DE mode.

8. The circuit of claim 7, wherein the circuit has an efficiency of at least 70%, wherein the efficiency is the ratio of input power to output power.

9. The circuit of claim 7, wherein the load network comprises at least one shunt element.

10. The circuit of claim 9, wherein the at least one shunt element comprises a first shunt element, the first shunt element comprising an inductor.

11. The circuit of claim 10, wherein the inductor is coupled to a terminal that is grounded during operation of the circuit.

12. The circuit of claim 11, wherein the terminal is virtually grounded such that the terminal is not coupled directly to true ground.

13. The circuit of claim 12, further comprising a bypass capacitor that couples the terminal to true ground.

14. The circuit of claim 13, wherein the terminal is virtually grounded via a connection to a corresponding terminal of another amplifier which is operated differentially with respect to the tuned class D amplifier.

15. The circuit of claim 10, further comprising a capacitor in series with the inductor, wherein the capacitor is a first capacitor, and wherein the at least one shunt element further comprises a second shunt element in parallel with the first shunt element, wherein the second shunt element comprises a second capacitor.

16. The circuit of claim 1, wherein the tuned class D amplifier comprises at least one transistor, and wherein the load network is tuned such that the at least one transistor only switches under zero-voltage and/or zero-current switching conditions.

17. The circuit of claim 1, wherein the pulsed RF output signal is substantially unfiltered.

18. The circuit of claim 1, wherein pulsed RF output signal comprises a square or trapezoidal waveform.

19. The circuit of claim 1, wherein the circuit is implemented in CMOS.

20. The circuit of claim 1, wherein the tuned class D amplifier comprises a push-pull amplifier having a push transistor that receives a first input signal and a pull transistor that receives a second input signal, wherein the first and second input signals are pulse-width modulated signals, wherein the first input signal has a first duty cycle and the second input signal has a second duty cycle different from the first duty cycle.

21. The circuit of claim 20, wherein the first and second duty cycles we selected such that the efficiency of the circuit is maximized, wherein efficiency is the ratio of input power to output power.

22. The circuit of claim 20, wherein the first and second duty cycles are selected such that the pulsed RF output signal has a desired duty cycle.

23. The circuit of claim 22, further comprising:
an input waveform generator that controls the first and second duty cycles such that the duty cycle of the pulsed RF output signal changes but the sum of the first and second duty cycles is at least substantially unchanged.

* * * * *

UNITED STATES PATENT AND TRADEMARK OFFICE
CERTIFICATE OF CORRECTION

PATENT NO. : 7,719,356 B2 Page 1 of 1
APPLICATION NO. : 11/985468
DATED : May 18, 2010
INVENTOR(S) : Robert J. McMorrow It is certified that error appears in the above-identified patent and that said Letters Patent is hereby corrected as shown below:

At column 11, claim 21, line 2, please replace "duty cycles we selected" with -- duty cycles are selected --.

Signed and Sealed this

Twenty-ninth Day of June, 2010

David J. Kappos
*Director of the United States Patent and Trademark Office*